(12) United States Patent
Geka (10) Patent No.: US 8,441,037 B2
(45) Date of Patent: May 14, 2013

(54) SEMICONDUCTOR DEVICE HAVING A THIN FILM STACKED STRUCTURE

(75) Inventor: Hirotaka Geka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 13/262,292

(22) PCT Filed: Mar. 31, 2010

(86) PCT No.: PCT/JP2010/002371
§ 371 (c)(1),
(2), (4) Date: Sep. 30, 2011

(87) PCT Pub. No.: WO2010/113501
PCT Pub. Date: Oct. 7, 2010

(65) Prior Publication Data
US 2012/0018782 A1    Jan. 26, 2012

(30) Foreign Application Priority Data
Oct. 14, 2009  (JP) .................................. 2009-237661

(51) Int. Cl.
*H01L 31/06* (2006.01)
*H01L 29/66* (2006.01)

(52) U.S. Cl.
USPC ..... 257/201; 257/192; 257/194; 257/E33.032

(58) Field of Classification Search .................. None
See application file for complete search history.

(56) References Cited

FOREIGN PATENT DOCUMENTS

| | | |
|---|---|---|
| JP | 3-038876 | 2/1991 |
| JP | 6-177167 | 6/1994 |
| JP | 08-306909 | 11/1996 |
| JP | 08306909 A * | 11/1996 |
| JP | 2003-332353 | 11/2003 |
| JP | 2003332353 A * | 11/2003 |
| JP | 2004-342743 | 12/2004 |
| JP | 2005-101119 | 4/2005 |
| JP | 2009-060042 | 3/2009 |
| JP | 2009060042 A * | 3/2009 |
| WO | 2008/007335 | 1/2008 |

OTHER PUBLICATIONS

Webster et al., "AlGaAsSb/InGaAs/AlGaAsSb Metamorphic MEMTs", IEEE Lester Eastman Conference on Aug. 6-8, 2002, pp. 315-323.
International Search Report for PCT/JP2010/002371.

* cited by examiner

*Primary Examiner* — Julio J Maldonado
*Assistant Examiner* — Harpreet Singh
(74) *Attorney, Agent, or Firm* — Morgan, Lewis & Bockius LLP (57) ABSTRACT

An objective is to provide a semiconductor device capable of utilizing properties of a high-mobility electron transport layer with a thin film stacked structure having large ΔEc, high electron mobility, and simplified element fabrication process even when the substrate material and the electron transport layer greatly differ in lattice constant. The semiconductor device includes: a semiconductor substrate (1); a first barrier layer (2) on the substrate (1); an electron transport layer (3) on the first barrier layer (2); and a second barrier layer (4) on the electron transport layer (3). The first barrier layer (2) has an $In_xAl_{1-x}As$ layer. At least one of the first barrier layer (2) and the second barrier layer (4) has a stacked structure having an $Al_yGa_{1-y}As_zSb_{1-z}$ layer in contact with the electron transport layer (3) and an $In_xAl_{1-x}As$ layer in contact with the $Al_yGa_{1-y}As_zSb_{1-z}$ layer. The stacked structure is doped with a donor impurity.

7 Claims, 4 Drawing Sheets

SEMICONDUCTOR DEVICE HAVING A THIN FILM STACKED STRUCTURE

RELATED APPLICATIONS

The present application is a U.S. National Phase Application of International Application No. PCT/JP2010/002371 (filed Mar. 31, 2010) which claims priority to Japanese Patent Application Nos. 2009-086150 (filed Mar. 31, 2009) and 2009-237661 (filed Oct. 14, 2009) which are hereby incorporated by reference in their entirety.

TECHNICAL FIELD

The present invention relates to a semiconductor device, and more specifically relates to a semiconductor device such as a high electron mobility transistor (HEMT) suitable as a transceiver amplifier for satellite broadcasting and a high-speed data transmission element as well as a highly sensitive magnetometer and the like.

BACKGROUND ART

Generally, a HEMT is known as a high-frequency element in the GHz band, which is represented by a transceiver amplifier for satellite broadcasting and the like. A typical example thereof includes one using a GaAs layer as an electron transport layer (GaAs-based HEMT). This utilizes a two-dimensional electron gas layer accumulated at a heterojunction interface formed on a GaAs substrate between AlGaAs serving as an electron supply layer and GaAs serving as an electron transport layer. Since electron mobility and electron saturation velocity is high in comparison with Si, GaAs is capable of operating a HEMT at high speed.

Figure 1A:
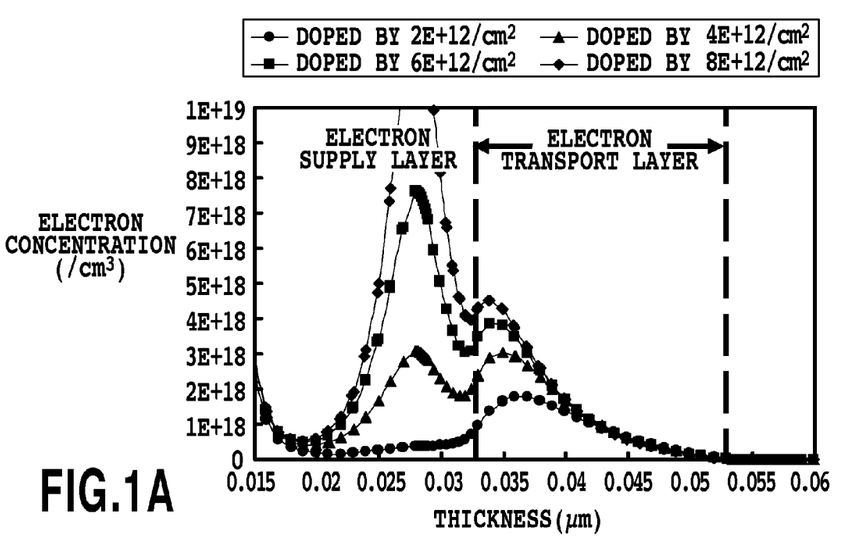
FIG. 1A is a graph illustrating an electron distribution with small $\Delta Ec$.
Figure 1B:
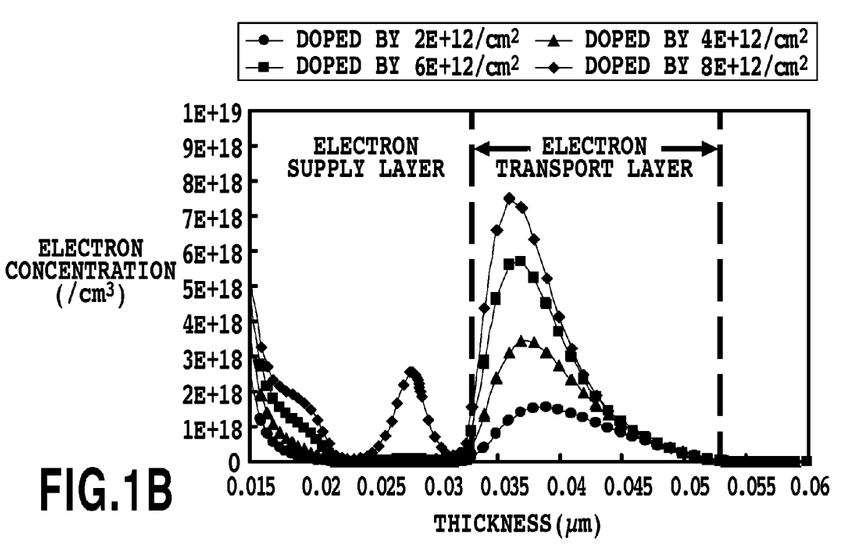
FIG. 1B is a graph illustrating an electron distribution with large $\Delta Ec$.

Here, a metamorphic-HEMT (mHEMT) is a HEMT in which the substrate material and the electron transport layer greatly differ from each other in lattice constant. In a case where the substrate and the electron transport layer greatly differ from each other in lattice constant, if the electron transport layer is formed directly on the substrate, lattice defects are generated, resulting in a problem that high electron mobility cannot be obtained. Thus, it is important to reduce this. Moreover, in the mHEMT, the larger the $\Delta Ec$ at the heterointerface between the electron supply layer and the electron transport layer, the greater the maximum value of the electron concentration in the electron transport layer. This contributes to an improvement in the element properties. Further, $\Delta Ec$ influences the electron distribution in the electron transport layer. The electron distribution with small $\Delta Ec$ and the electron distribution with large $\Delta Ec$ are illustrated in FIG. 1A and FIG. 1B, respectively. In FIG. 1A, electrons are concentrated near the heterointerface between the electron transport layer and the electron supply layer. This trend becomes prominent as the amount of donor impurity doped is increased. In contrast, in FIG. 1B, even if the amount of donor impurity doped is increased, electrons are located relatively away from the heterointerface. Since the vicinity of the heterointerface is susceptible to the interface roughness and the like, the electron mobility is expected to be higher in a case where electrons are located away from the heterointerface than a case where the electrons are concentrated near the heterointerface. In other words, the electron mobility is expected to be improved with large $\Delta Ec$.

From the above, to obtain an $In_xGa_{1-x}As$ electron transport layer with a high electron mobility in the mHEMT, the following two points are important: to sufficiently reduce the difference in lattice constant between the substrate and the electron transport layer; and to increase $\Delta Ec$ at the heterointerface with the electron supply layer.

Meanwhile, Patent Literature 1 discloses a stacked structure in which an $Al_yGa_{1-y}AsSb$ layer ($0.3<y\leq0.8$) and an $In_xGa_{1-x}As$ layer ($0.2\leq y\leq0.9$) are sequentially formed on a GaAs substrate or a Si substrate and further an $Al_yGa_{1-y}AsSb$ layer ($0.3<y\leq0.8$) is formed on the layers.

Further, Non-Patent Literature 1 discloses a thin film stacked structure in which an AlGaAsSb step-graded buffer layer with discretely varied lattice constant is used as a buffer layer to reduce the difference in lattice constant between a GaAs substrate and an $In_{0.8}Ga_{0.2}As$ electron transport layer. In the stacked structures in Patent Literature 1 and Non-Patent Literature 1, AlGaAsSb is used for both of the buffer layer and the electron supply layer with respect to the InGaAs electron transport layer. Since AlGaAsSb is low in electron affinity in comparison with InAlAs and InAlGaAs that are widely used in InP-based HEMTs and the like, large $\Delta Ec$ can be achieved.

Additionally, Patent Literature 2 discloses using a stacked structure with an InAlAs layer adjacent to an InGaAs electron transport layer and an $Al_yGa_{1-y}As_zSb_{1-z}$ layer ($0.8\leq y\leq1$) adjacent to the InAlAs layer as an electron supply layer to increase $\Delta Ec$.

However, in the stacked structures in Patent Literature 1 and Non-Patent Literature 1, particularly the AlGaAsSb buffer layer for reducing the difference in lattice constant between the substrate and the electron transport layer needs to have a thickness of at least 0.5 μm, or 1 μm or larger in some cases. AlGaAsSb is likely to be oxidized in comparison with InAlAs and InAlGaAs that are widely used in InP-based HEMTs and the like. Also, AlGaAsSb is difficult to perform mesa etching for element isolation, selective recess etching for exposing the surface of AlGaAsSb to form a gate electrode, and the like. These lead to a problem that the element fabrication process becomes difficult. These problems become more prominent as the thickness of the AlGaAsSb layer is increased larger and larger.

Figure 2:
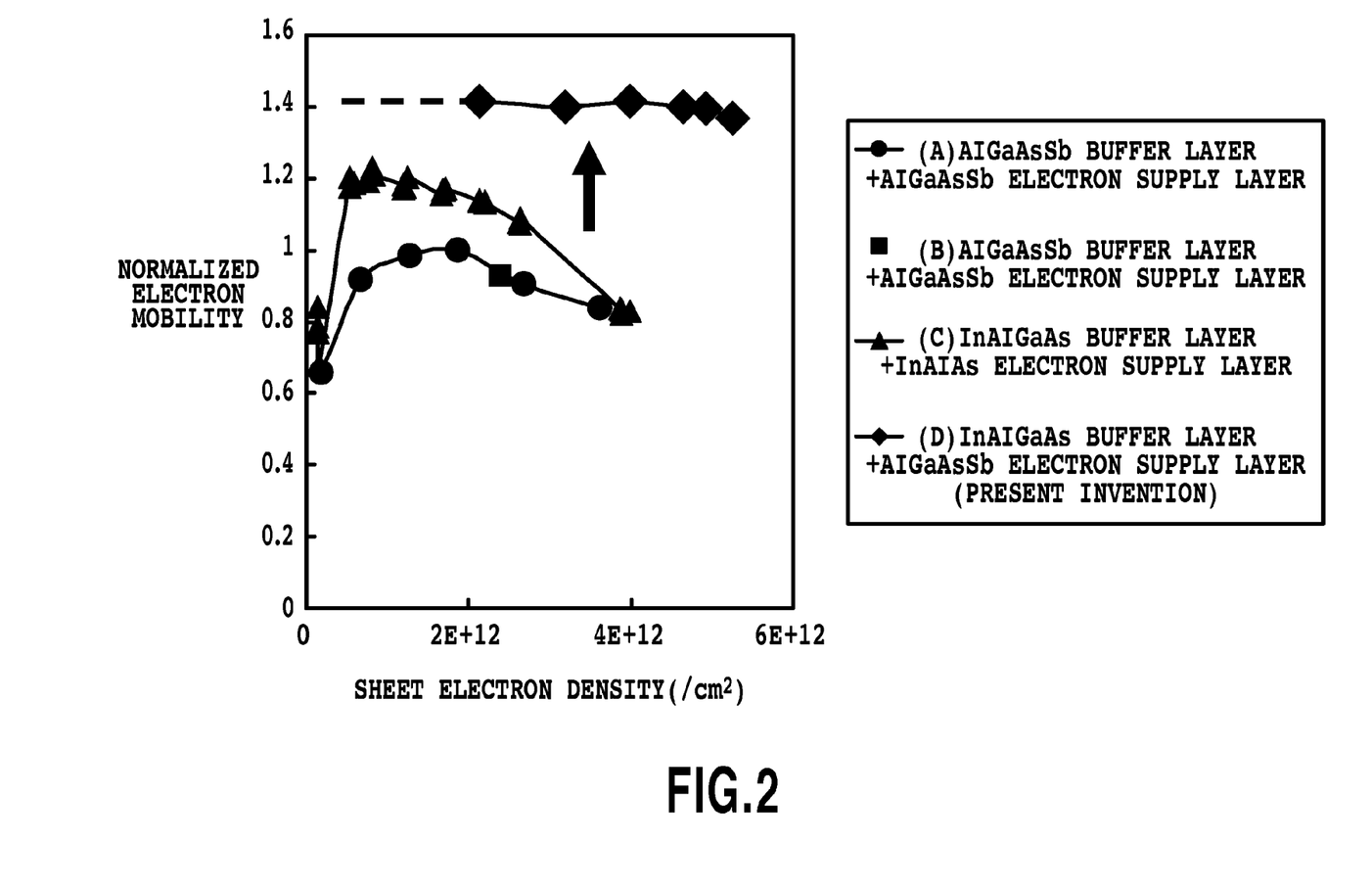
FIG. 2 is a graph illustrating a relationship between sheet electron density and normalized electron mobility in four types of thin film stacked structures.

Furthermore, with the stacked structures described in these documents, the InGaAs electron transport layer does not have sufficient electron mobility. FIG. 2 illustrates a relationship between sheet electron density and normalized electron mobility in three types of stacked structures (A), (B), and (C). The sheet electron density is controlled by changing the donor impurity concentration. In the stacked structure (A), an $Al_{0.53}Ga_{0.47}As_{0.2}Sb_{0.8}$ layer with a thickness of 0.6 μm, an $In_{0.8}Ga_{0.2}As$ layer with a thickness of 20 nm, a Sn-doped $Al_{0.53}Ga_{0.47}As_{0.2}Sb_{0.8}$ layer with a thickness of 35 nm, and an $In_{0.8}Ga_{0.2}As$ layer with a thickness of 10 nm are sequentially stacked on a GaAs substrate. The stacked structure (B) is one described in Non-Patent Literature 1, in which the AlGaAsSb step-graded layer is used as the buffer layer. The values in the literature are used as the electron mobility values herein without any change. In the stacked structure (C), an $In_xAl_{0.3}Ga_{0.7-x}As$ ($x=0\rightarrow0.7$) graded layer with a thickness of 1 μm, an $In_{0.7}Al_{0.3}As$ layer with a thickness of 350 nm, an $In_{0.8}Ga_{0.2}As$ layer with a thickness of 20 nm, a Si-doped $In_{0.7}Al_{0.3}As$ layer with a thickness of 16 nm, and an $In_{0.8}Ga_{0.2}As$ layer with a thickness of 10 nm are sequentially stacked on a GaAs substrate. Comparing the electron mobility values, the followings can be seen: the electron mobility values are equivalent between (A) and (B) in each of which AlGaAsSb is used for both the buffer layer and the electron supply layer, and the electron mobility in the case of (C) in which InAlGaAs is used for the buffer layer and InAlAs is used for the electron supply layer is higher than those in (A) and (B). Namely, it can be said that since the effect of the AlGaAsSb buffer layer in the stacked structures (A) and (B) is insufficient in comparison with those of the InAlGaAs and InAlAs buffer layers in the stacked structure (C), the electron mobility is low although $\Delta Ec$ is large.

In addition, according to the configuration described in Patent Literature 2, an InAlAs intermediate layer exists between the InGaAs layer and the $Al_yGa_{1-y}As_zSb_{1-z}$ layer ($0.8 \leq y \leq 1$). This brings about a problem that abrupt heterointerface is hard to obtain.

As described above, a thin film stacked structure with large $\Delta Ec$, high electron mobility, and simplified element fabrication process has not been achieved yet.

CITATION LIST

Patent Literatures

PTL 1: Japanese Patent Laid-Open No. H8-306909 (1996)
PTL 2: International Patent Application Publication No. WO2008/007335

Non-Patent Literature

NPL 1: High Performance Devices, 2002. Proceedings, IEEE Lester Eastman Conference on 6-8 Aug. 2002, pp. 315-323.

SUMMARY OF INVENTION

The present invention has been made in view of such problems. An objective thereof is to provide a semiconductor device capable of utilizing properties of a high-mobility electron transport layer by providing a thin film stacked structure with large $\Delta Ec$, high electron mobility, and simplified element fabrication process even in a case where the substrate material and the electron transport layer greatly differ from each other in lattice constant.

To achieve such an objective, a first aspect of the present invention is a semiconductor device comprising a semiconductor substrate: a first barrier layer on the semiconductor substrate; an electron transport layer on the first barrier layer and composed of $In_aGa_{1-a}As$ ($0 < a \leq 1$); and a second barrier layer on the electron transport layer. The first barrier layer has an $In_xAl_{1-x}As$ layer. At least one of the first and the second barrier layers has a stacked structure with an $Al_yGa_{1-y}As_zSb_{1-z}$ layer in contact with the electron transport layer and an $In_xAl_{1-x}As$ layer in contact with the $Al_yGa_{1-y}As_zSb_{1-z}$ layer. The stacked structure is doped with a donor impurity.

Moreover, a second aspect of the present invention is a semiconductor device according to the first aspect, wherein the semiconductor substrate comprises an $In_xAl_{1-x}As$ layer or an $In_xAl_{1-x-y}Ga_yAs$ layer which has a composition controlled in such a manner that a lattice constant value discretely or continuously approaches a value of the electron transport layer from a value of a semiconductor material of the semiconductor substrate.

Moreover, a third aspect of the present invention is a semiconductor device according to the first or second aspect, wherein the $Al_yGa_{1-y}As_zSb_{1-z}$ layer in contact with the electron transport layer is doped with a donor impurity.

Moreover, a fourth aspect of the present invention is a semiconductor device according to the third aspect, wherein the donor impurity is Sn.

Moreover, a fifth aspect of the present invention is a semiconductor device according to any one of the first to the fourth aspects, wherein an Al composition y in the $Al_yGa_{1-y}As_zSb_{1-z}$ layer is not smaller than 0.3 and not larger than 0.8.

Moreover, a sixth aspect of the present invention is a semiconductor device according to any one of the first to the fifth aspects, the $Al_yGa_{1-y}As_zSb_{1-z}$ layer has a thickness of not smaller than 1 nm and not larger than 100 nm.

Moreover, a seventh aspect of the present invention is a semiconductor device according to any one of the first to the sixth aspects, wherein a cap layer is provided on the second barrier layer.

Moreover, an eighth aspect of the present invention is a semiconductor device according to any one of the first to the seventh aspects, wherein each of the first and the second barrier layers has a stacked structure having a $Al_yGa_{1-y}As_zSb_{1-z}$ layer in contact with the electron transport layer and a $In_xAl_{1-x}As$ layer in contact with the $Al_yGa_{1-y}As_zSb_{1-z}$ layer.

According to the present invention, at least one of the barrier layers has the stacked structure with the $Al_yGa_{1-y}As_zSb_{1-z}$ layer in contact with the electron transport layer and the $In_xAl_{1-x}As$ layer in contact with the $Al_yGa_{1-y}As_zSb_{1-z}$ layer, and the stacked structure is doped with a donor impurity. It makes it possible to achieve a thin film stacked structure with large $\Delta Ec$, high electron mobility, and simplified element fabrication process even in a case where the substrate material and the electron transport layer greatly differ from each other in lattice constant. Thus, it is possible to provide a semiconductor device capable of demonstrating original high-speed operation and high sensitivity when a HEMT, a magnetometer, or the like is fabricated.

DESCRIPTION OF EMBODIMENTS

In the following description, a semiconductor device according to the present invention will be described taking a high electron mobility transistor (HEMT) that is one type of a field-effect transistor as an example. Nevertheless, the same applies to semiconductor devices such as field-effect transistors (FETs) and a magnetometer, as long as the spirit of the present invention is satisfied.

(Multilayer Film Structure for Fabricating HEMT According to the Present Invention)

Figure 3:
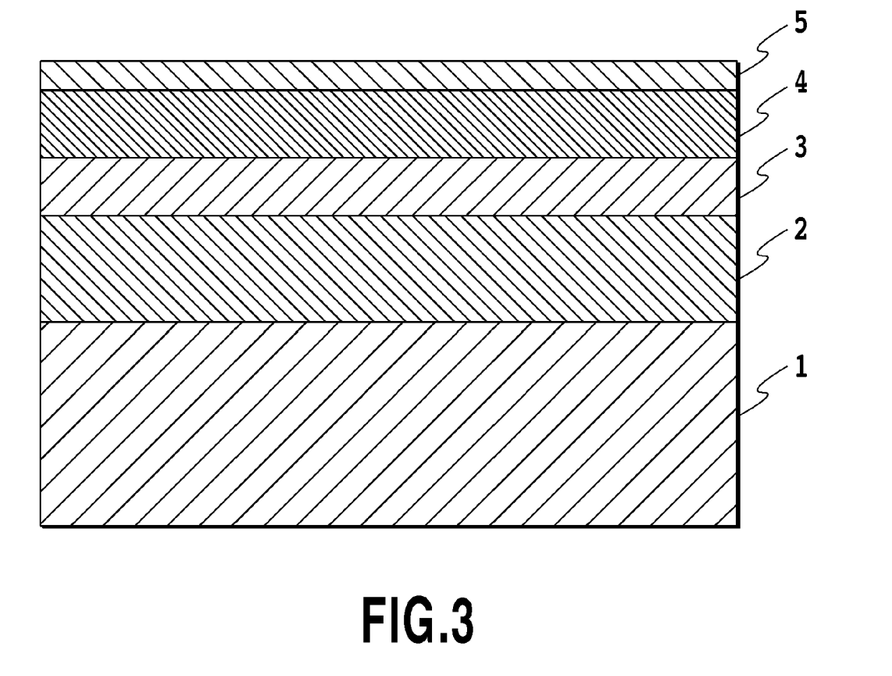
FIG. 3 is a cross-sectional view showing a multilayer film structure for fabricating a field-effect transistor according to the present invention.

FIG. 3 is a cross-sectional view showing a multilayer film structure for fabricating a field-effect transistor according to the present invention. A first barrier layer 2 is provided on a substrate 1, and an electron transport layer 3 is disposed on the first barrier layer 2. A second barrier layer 4 and a cap layer 5 are sequentially stacked on the electron transport layer 3. Common methods for forming a compound semiconductor can be employed for this multilayer film structure. Molecular beam epitaxy (MBE), metal organic chemical vapor deposition (MOCVD), and the like are used.

Any substrate may be used as the substrate 1, but a GaAs substrate, an InP substrate or a GaP substrate, a Si substrate having single-crystal GaAs grown on a surface thereof, a sapphire substrate, or the like is preferable. Above all, a GaAs substrate is particularly preferable since a semi-insulating high-quality single crystal substrate with a large diameter can be obtained at low cost. Semi-insulating herein refers to one having a resistivity of $10^7$ $\Omega \cdot$cm or higher.

In a case where a single crystal substrate is used, the plane direction of the substrate is preferably (100), (111), (110), or the like. A plane direction shifted from any of these plane directions by 1° to 5° may be used. Above all, (100) is optimum from the viewpoint of growing a high-quality thin film.

In order to planarize and clean the surface of the substrate as in usual practices, a substrate on which a semiconductor composed of the same material as the substrate is grown may be used as the substrate 1 of the present invention. Growing GaAs on a GaAs substrate is a typical example of this.

Furthermore, in a case where the substrate 1 and the electron transport layer 3 greatly differ from each other in lattice constant, the substrate 1 with a buffer layer using a material of approximate lattice constant to the electron transport layer 3 grown thereon may be used as a substrate 1. Here, the buffer layer preferably has: (a) a lattice constant approximate to that of the electron transport layer 3; (b) a sufficiently high resistivity in comparison with the electron transport layer 3; and (c) a flat surface with few defects even in a case where the buffer layer is directly stacked on a substrate such as GaAs having a lattice constant greatly different from that of the electron transport layer 3. In conformity with the purposes, it is possible to use: a graded buffer layer the lattice constant of which changes continuously between the substrate 1 and the electron transport layer 3; a step-graded buffer layer the lattice constant of which changes discretely therebetween; or various buffer layers that are combinations of these. Examples of the material of the buffer layer include InAlAs, InAlGaAs, AlGaAsSb, and the like. InAlAs and InAlGaAs are particularly preferable because the element fabrication process is more simplified and high electron mobility is obtained.

The first barrier layer 2 preferably has: (a) a lattice constant approximate to that of the electron transport layer 3; (b) sufficiently high resistivity in comparison with the electron transport layer 3; and (c) a flat surface with few defects even in a case where the first barrier layer 2 is directly stacked on the substrate 1. As the first barrier layer 2, $In_xAl_{1-x}As$ and $Al_yGa_{1-y}As_zSb_{1-z}$ are particularly preferable, and a single-layer film of each of these materials may be used and also a stacked structure of an $In_xAl_{1-x}As$ layer and an $Al_yGa_{1-y}As_zSb_{1-z}$ layer may be used. The first barrier layer preferably has the stacked structure of the $In_xAl_{1-x}As$ layer and the $Al_yGa_{1-y}As_zSb_{1-z}$ layer because the $Al_yGa_{1-y}As_zSb_{1-z}$ layer having a flat surface with few defects can be formed to obtain high electron mobility. In a case where a stacked structure having the $Al_yGa_{1-y}As_zSb_{1-z}$ layer in contact with the electron transport layer 3 and the $In_xAl_{1-x}As$ layer in contact with the $Al_yGa_{1-y}As_zSb_{1-z}$ layer is used as the first barrier layer 2, at least a portion thereof may be doped with a donor impurity. When doped, the first barrier layer 2 serves as an electron supply layer.

The electron affinity of the $Al_yGa_{1-y}As_zSb_{1-z}$ layer is lower than the electron affinity of $In_xAl_{1-x}As$ layer. Thus, it is preferable to dope at least a portion of the $Al_yGa_{1-y}As_zSb_{1-z}$ layer in contact with the electron transport layer 3 with the donor impurity because ΔEc can be increased.

In this case, any donor impurity may be used, as long as it functions as a donor. However, since Group VI elements such as Se and Te are high in vapor pressure and difficult to handle, Group IV elements Si and Sn are preferable when possible. Nonetheless, since Si is likely to serve as an acceptor with respect to the $Al_yGa_{1-y}As_zSb_{1-z}$ layer, Sn is particularly preferable.

A large Al composition y in the $Al_yGa_{1-y}As_zSb_{1-z}$ layer is preferable because the larger the Al composition y, the lower the electron affinity. However, too large y makes it difficult to control the crystal interface with the electron transport layer, and moreover causes such device reliability problems that the $Al_yGa_{1-y}As_zSb_{1-z}$ layer is susceptible to oxidization. Thus, the Al composition y is preferably not smaller than 0.3 and not larger than 0.8.

The $Al_yGa_{1-y}As_zSb_{1-z}$ layer preferably has a thickness of not smaller than 1 nm and not larger than 100 nm because too large thickness makes the element fabrication process difficult.

The electron concentration in the $In_xGa_{1-x}As$ ($0<x\leq1$) electron transport layer 3 is changed with a voltage applied to a control electrode such as a gate electrode 402 (see FIG. 4), and thereby the electrical conduction is controlled. A large In composition x in the $In_xGa_{1-x}As$ ($0<x\leq1$) electron transport layer 3 is preferable because the larger the In composition x, the higher the electron mobility to be obtained. Particularly, the In composition x is preferably not smaller than 0.20 and not larger than 1 for a GaAs substrate, and preferably not smaller than 0.53 and not larger than 1 for an InP substrate. With the In composition within such a range, higher electron mobility can be obtained than that of an electron transport layer used in an existing pseudomorphic-HEMT (a so-called p-HEMT) in a case of a GaAs substrate and used in an existing InP-based HEMT in a case of an InP substrate. If the electron transport layer 3 is too thin, the electron transport layer 3 is more likely to be influenced by the flatness and defect in the interface. Meanwhile, too large thickness influences the controllability of the control electrode. Thus, the thickness is preferably not larger than 2000 nm, more preferably not smaller than 2 nm and not larger than 100 nm, and further preferably not smaller than 5 nm and not larger than 60 nm.

Moreover, the electron concentration in the $In_xGa_{1-x}As$ electron transport layer 3 is preferably not lower than $5\times10^{17}$ cm$^{-3}$ and not higher than $5\times10^{18}$ cm$^{-3}$ because of a high electron mobility at such a concentration. Nevertheless, the electron concentration is appropriately determined based on the device properties such as sheet resistance and rapid responsiveness of the semiconductor device. Thus, the electron concentration is not limited thereto.

The second barrier layer 4 preferably has: (a) a lattice constant approximate to that of the electron transport layer 3; (b) sufficiently high resistivity in comparison with the electron transport layer 3; and (c) a flat surface with few defects even in a case where the second barrier layer 4 is directly stacked on the electron transport layer 3. As the second barrier layer 4, $In_xAl_{1-x}As$ and $Al_yGa_{1-y}As_zSb_{1-z}$ are particularly preferable, and a single-layer film of each of these materials may be used. Also, the second barrier layer 4 may have a stacked structure of an $In_xAl_{1-x}As$ layer and an $Al_yGa_{1-y}As_zSb_{1-z}$ layer. If the thickness is too small, there is an insulation problem. Too large thickness influences the controllability of the electron transport layer 3 by the gate electrode. Thus, the thickness is preferably not smaller than 1 nm and not larger than 50 nm, and further preferably not smaller than 2 nm and not larger than 20 nm.

In a case where a stacked structure having an $Al_yGa_{1-y}As_zSb_{1-z}$ layer in contact with the electron transport layer 3 and an $In_xAl_{1-x}As$ layer in contact with the $Al_yGa_{1-y}As_zSb_{1-z}$ layer is used as the second barrier layer 4, at least a portion thereof may be doped with a donor impurity. When doped, the second barrier layer 4 serves as an electron supply layer.

The electron affinity of the $Al_yGa_{1-y}As_zSb_{1-z}$ layer is lower than the electron affinity of the $In_xAl_{1-x}As$ layer. Thus, it is preferable to dope at least a portion of the $Al_yGa_{1-y}As_zSb_{1-z}$ layer in contact with the electron transport layer 3 with the donor impurity because ΔEc can be increased.

In this case, any donor impurity may be used, as long as it functions as a donor. However, since Group VI elements such as Se and Te are high in vapor pressure and difficult to handle, Group IV elements such as Si and Sn are preferable when possible. Nonetheless, since Si is likely to serve as an acceptor with respect to the $Al_yGa_{1-y}As_zSb_{1-z}$ layer, Sn is particularly preferable.

A large Al composition y in the $Al_yGa_{1-y}As_zSb_{1-z}$ layer is preferable because the larger the Al composition y, the lower the electron affinity. However, too large y makes it difficult to control the crystal interface with the electron transport layer, and moreover causes such device reliability problems that the $Al_yGa_{1-y}As_zSb_{1-z}$ layer is susceptible to oxidization. Thus, the Al composition y is preferably not smaller than 0.3 and not larger than 0.8.

The $Al_yGa_{1-y}As_zSb_{1-z}$ layer preferably has a thickness of not smaller than 1 nm and not larger than 100 nm because too large thickness makes the element fabrication process difficult.

The cap layer 5 is formed on the aforementioned second barrier layer 4. A main purpose thereof is to suppress degradation due to oxidation of a layer under it. Thus, in conformity with this purpose, any material can be selected. Accordingly, a semiconductor film, a polymer film, or an insulating film can be used preferably. Moreover, the second barrier layer 4 and the cap layer 5 may be formed as a single layer for achieving both purposes. Nevertheless, normally a semiconductor film is used because the layer under the cap layer 5 can be prevented from being exposed to oxygen if the same film formation procedure is performed as those for the electron supply layer 3 and the second barrier layer 4 described above. As the semiconductor film that can be used as the cap layer, the same material as that of the electron transport layer 3 is often used, and particularly InGaAs is used. The cap layer 5 preferably has a thickness not smaller than 1 nm and not larger than 50 nm.

Example 1

Here, Example 1 will be described in which a multilayer film structure for fabricating the HEMT according to the present invention was fabricated.

In fabricating the multilayer film structure, Molecular beam epitaxy method (MBE method) was employed. First, while radiated with As, a semi-insulating GaAs (100) substrate was heated to 630° C. and oxygen on the surface was removed. In this state, the substrate temperature was lowered to 580° C., and then a GaAs buffer layer was grown to a thickness of 100 nm. Subsequently, after the substrate temperature was lowered to 400° C., an $Al_{0.45}In_xGa_{0.55-x}As$ (x=0→0.55) graded buffer layer having a thickness of 1000 nm and an $In_{0.55}Al_{0.45}As$ buffer layer having a thickness of 250 nm were grown. Further, after the substrate temperature was raised to 450° C., an $In_{0.55}Al_{0.45}As$ layer having a thickness of 100 nm was grown as the first barrier layer 2; an $In_{0.56}Ga_{0.44}As$ layer having a thickness of 20 nm was grown as the electron transport layer 3; an $Al_{0.5}Ga_{0.5}As_{0.5}Sb_{0.5}$ layer having a thickness of 4 nm, a Sn delta doped layer, an $Al_{0.5}Ga_{0.5}As_{0.5}Sb_{0.5}$ layer having a thickness of 4 nm, and an $In_{0.55}Al_{0.45}As$ layer having a thickness of 8 nm were grown as the second barrier layer 4; and an $In_{0.56}Ga_{0.44}As$ layer having a thickness of 10 nm was grown as the cap layer 5 in the final sequence.

Here, the Sn delta doped layer is a layer formed by being simultaneously radiated with a dopant Sn and Group V elements, As and Sb. Since no Group III element was radiated, the doping was performed with no thin film growth progress. As a result, the thickness of the Sn delta doped layer was as close as possible to zero, and strictly the thickness was on the order of several atomic layers. In other words, a Sn doped $Al_{0.5}Ga_{0.5}As_{0.5}Sb_{0.5}$ layer having a thickness of several atomic layers was present.

As a result of the hole measurement, the electron mobility was 10500 cm$^2$/Vs, and the sheet electron density was $3.19 \times 10^{12}$/cm$^2$. Thus, very high electron mobility was obtained.

Here, Table 1 shows the film properties obtained by changing the material of the second barrier layer 4 for comparison. Layers written at the leftmost are layers in contact with the electron transport layer 3, while layers written at the rightmost are layers in contact with the cap layer 5.

TABLE 1

| Second barrier layer 4 | Distance between AlGaAsSb and electron transport layer 3 (nm) | Electron mobility (cm$^2$/Vs) | Sheet electron density (/cm$^2$) |
| --- | --- | --- | --- |
| AlGaAsSb (4 nm)/Sn delta doped layer/AlGaAsSb (4 nm)/InAlAs (8 nm), the present invention | 0 | 10500 | 3.19E+12 |
| InAlAs (2 nm)/AlGaAsSb (2 nm)/Sn delta doped layer/AlGaAsSb (6 nm)/InAlAs (6 nm) | 2 | 9800 | 3.19E+12 |
| InAlAs (4 nm)/Sn delta doped layer/AlGaAsSb (8 nm)/InAlAs (4 nm) | 4 | 9400 | 3.55E+12 |
| InAlAs (4 nm)/Sn delta doped layer/InAlAs (2 nm)/AlGaAsSb (8 nm)/InAlAs (2 nm) | 6 | 8300 | 3.65E+12 |
| InAlAs (4 nm)/Sn delta doped layer/InAlAs (12 nm) | — | 8600 | 3.30E+12 |

Also from the result shown in Table 1, the shorter the distance between the electron transport layer 3 and the AlGaAsSb layer, the higher the electron mobility. Particularly, the structure of the present invention in which the AlGaAsSb layer is in contact with the electron transport layer 3 showed the highest electron mobility and the effect of the present invention is noticeable.

This effect becomes more prominent when the amount of donor impurity doped to the electron supply layer is increased. In Table 1, in the conventional structure in which the second barrier layer 4 was InAlAs (4 nm)/Sn delta doped layer/InAlAs (12 nm), as the doping amount was increased, the electron mobility tends to be lowered. For example, by merely increasing the sheet electron density to 3.67E+12 (/cm$^2$), the electron mobility was lowered down to 7600 cm$^2$/Vs. Meanwhile, in Table 1, according to the present invention in which the second barrier layer 4 was AlGaAsSb (4 nm)/Sn delta doped layer/AlGaAsSb (4 nm)/InAlAs (12 nm), even when the sheet electron density was increased to 5E+12 (/cm$^2$), the electron mobility was 10500 cm$^2$/Vs, and a high electron mobility was maintained. In other words, both the electron concentration and the electron mobility in the electron transport layer can take large values. Such properties indicate that high electron mobility and low sheet resistance can be achieved at the same time, and ideal for fabricating HEMTs.

From the above, the use of the thin film stacked structure of the present invention can increase ΔEc because AlGaAsSb is used as the electron supply layer. Moreover, since the thickness of the AlGaAsSb layer is small, the element fabrication process is also simplified, and high electron mobility can be obtained.

Example 2

Here, Example 2 will be described in which a multilayer film structure for fabricating the HEMT according to the present invention was fabricated.

In fabricating the multilayer film structure, Molecular beam epitaxy method (MBE method) was employed. First, while radiated with As, a semi-insulating GaAs (100) substrate was heated to 630° C. and oxygen on the surface was removed. In this state, the substrate temperature was lowered to 580° C., and then a GaAs buffer layer was grown to a thickness of 100 nm. Subsequently, after the substrate temperature was lowered to 400° C., an $Al_{0.45}In_xGa_{0.55-x}As$ (x=0→0.55) graded buffer layer having a thickness of 1000 nm and an $In_{0.55}Al_{0.45}As$ buffer layer having a thickness of 250 nm were grown. Further, after the substrate temperature was raised to 450° C., an $In_{0.55}Al_{0.45}As$ layer having a thickness of 90 nm, an $Al_{0.5}Ga_{0.5}As_{0.5}Sb_{0.5}$ layer having a thickness of 5 nm, a Sn delta doped layer, an $Al_{0.5}Ga_{0.5}As_{0.5}Sb_{0.5}$ layer having a thickness of 5 nm were grown as the first barrier layer 2; an $In_{0.56}Ga_{0.44}As$ layer having a thickness of 20 nm was grown as the electron transport layer 3; an $Al_{0.5}Ga_{0.5}As_{0.5}Sb_{0.5}$ layer having a thickness of 9 nm, a Sn delta doped layer, an $Al_{0.5}Ga_{0.5}As_{0.5}Sb_{0.5}$ layer having a thickness of 4 nm, and an $In_{0.55}Al_{0.45}As$ layer having a thickness of 8 nm were grown as the second barrier layer 4; and a Sn-doped $In_{0.56}Ga_{0.44}As$ layer having a thickness of 10 nm was grown as the cap layer 5 in the final sequence.

As a result of the hole measurement, the electron mobility was 9430 cm$^2$/Vs, and the sheet electron density was 6.20× 10$^{12}$/cm$^2$. Thus, very high electron mobility was obtained.

Here, as for the properties when the first barrier layer 2 which was formed of an $In_{0.55}Al_{0.45}As$ layer having a thickness of 95 nm, a Sn delta doped layer, and an $In_{0.55}Al_{0.45}As$ layer having a thickness of 5 nm, the electron mobility was 9080 cm$^2$/Vs, and the sheet electron density was 6.28×10$^{12}$/cm$^2$.

To be more specific, also in the case where the first barrier layer 2 is used as the electron supply layer, it is preferable that the first barrier layer 2 be formed of an AlGaAsSb layer in contact with the electron transport layer 3 and an InAlAs layer in contact with the AlGaAsSb layer because the electron mobility is high.

Example 3

Here, Example 3 will be described in which a multilayer film structure was constructed for fabricating the HEMT according to the present invention.

In fabricating the multilayer film structure, Molecular beam epitaxy method (MBE method) was employed. First, while radiated with As, a semi-insulating GaAs (100) substrate was heated to 630° C. and oxygen on the surface was removed. In this state, the substrate temperature was lowered to 580° C., and then a GaAs buffer layer was grown to a thickness of 100 nm. Subsequently, after the substrate temperature was lowered to 400° C., an $Al_{0.3}In_xGa_{0.7-x}As$ (x=0→0.7) graded buffer layer having a thickness of 1400 nm and an $In_{0.7}Al_{0.3}As$ buffer layer having a thickness of 250 nm were grown. Further, after the substrate temperature was raised to 450° C., an $In_{0.7}Al_{0.3}As$ layer having a thickness of 100 nm was grown as the first barrier layer 2; an $In_{0.8}Ga_{0.2}As$ layer having a thickness of 20 nm was grown as the electron transport layer 3; an $Al_{0.53}Ga_{0.47}As_{0.2}Sb_{0.8}$ layer having a thickness of 4 nm, a Sn delta doped layer, an $Al_{0.53}Ga_{0.47}As_{0.2}Sb_{0.8}$ layer having a thickness of 4 nm, and an $In_{0.7}Al_{0.3}As$ layer having a thickness of 8 nm were grown as the second barrier layer 4; and a Sn-doped $In_{0.8}Ga_{0.2}As$ layer having a thickness of 10 nm was grown as the cap layer 5 in the final sequence.

The electron mobility obtained based on the hole measurement was plotted in FIG. 2. It can be seen that the effect of the present invention is significant because the electron mobility is very high in comparison with conventional structures.

(HEMT According to the Present Invention)

Figure 4:
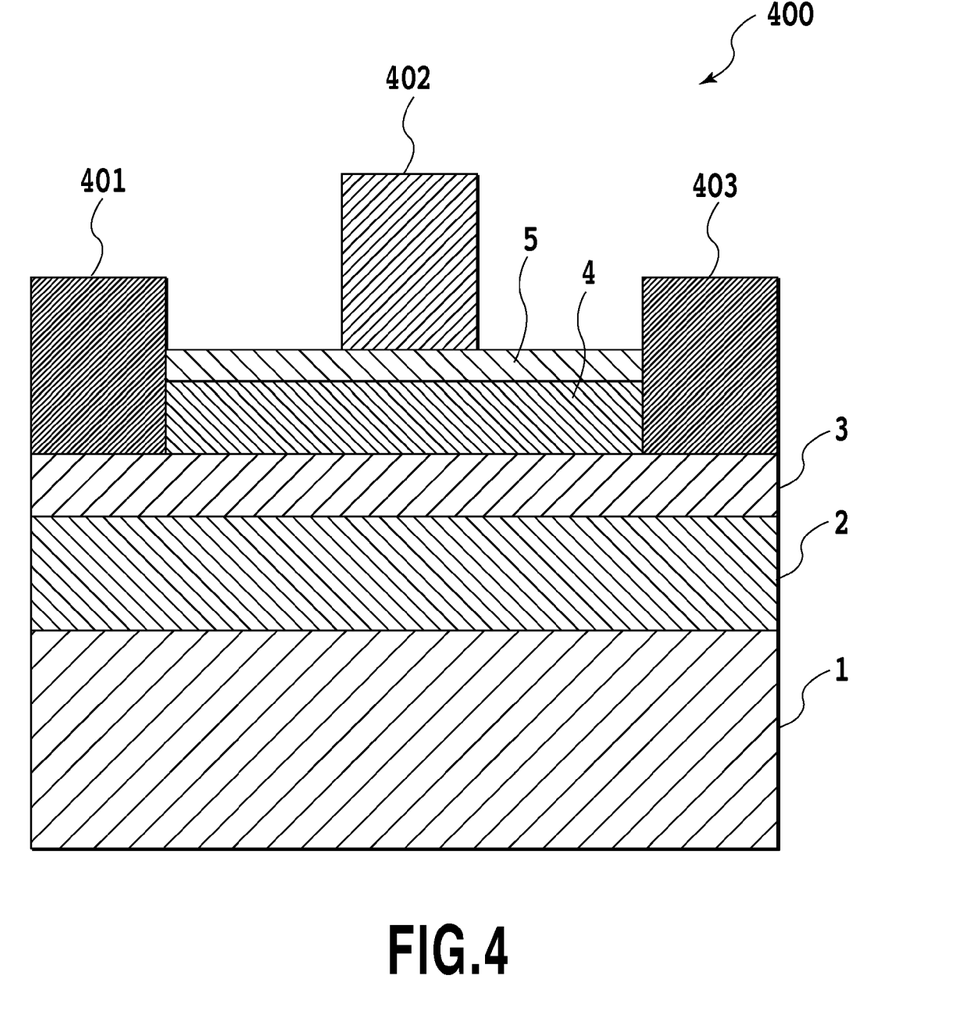
FIG. 4 is a cross-sectional view showing a high electron mobility transistor (HEMT) according to the present invention.

FIG. 4 is a cross-sectional view showing the HEMT according to the present invention. A HEMT 400 includes the semiconductor substrate 1, the first barrier layer 2 on the semiconductor substrate 1, the electron transport layer 3 on the first barrier layer 2, the second barrier layer 4 on the electron transport layer 3, and the cap layer 5 on the second barrier layer 4.

A source electrode 401 and a drain electrode 403 used in HEMT 400 need to form an ohmic contact with the $In_xGa_{1-x}As$ electron transport layer 3 under them. Although there are various structures for an ohmic contact, the ohmic contact is in direct contact with the $In_xGa_{1-x}As$ electron transport layer 3 in the structure of FIG. 4.

The $In_xGa_{1-x}As$ electron transport layer 3 has a small bandgap, and an ohmic contact with a low contact resistance is obtained only by bringing an electrode into contact with the electron transport layer 3. For this reason, the electrodes can be formed directly on the surface of the $In_xGa_{1-x}As$ channel layer 3 exposed by sequentially etching the cap layer 5 and the second barrier layer 4 only at lower portions thereof below the ohmic electrodes 401 and 403.

In this case, to reduce the contact resistance between the electrodes 401, 403 and the $In_xGa_{1-x}As$ channel layer 3, alloying may be carried out; nonetheless, a favorable ohmic contact can be obtained only by deposition. Hence, the electrode metal may have a known stacked electrode structure including a three-layer structure of AuGe/Ni/Au, but also may be a single-layer metal such as Al, Ti, Au, and W. A larger number of combinations are applicable.

It is only necessary for the gate electrode 402 to form a depletion layer therebelow. A method using a Schottky junction as well as a MIS (METAL-INSULATOR-SEMICONDUCTOR) structure with an insulator interposed between the gate electrode and the $In_xGa_{1-x}As$ electron transport layer 3, and a PN junction can be utilized. Particularly, as the material forming the Schottky junction with the second barrier layer 4, Al, Ti, W, Pt, WSi, Au, and the like are preferable, or these in a stacked structure may be used.

The structure of the source electrode 401, the gate electrode 402, and the drain electrode 403 of the present invention is only an example, and a gate recess structure in which a low resistance contact layer is provided on the surface of the cap layer 5, or other structures can be fabricated according to the spirit of the present invention. Other known electrode structures are also applicable.

The invention claimed is:

1. A semiconductor device, comprising:
    a semiconductor substrate;
    a first barrier layer on the semiconductor substrate;
    an electron transport layer on the first barrier layer and composed of $In_aGa_{1-a}As$ (0<a≦1); and
    a second barrier layer on the electron transport layer,
    wherein the first barrier layer has an $In_xAl_{1-x}As$ layer,
    wherein each of the first and the second barrier layers has a stacked structure with an $Al_yGa_{1-y}As_zSb_{1-z}$ layer in contact with the electron transport layer and an $In_xAl_{1-x}As$ layer in contact with the $Al_yGa_{1-y}As_zSb_{1-z}$ layer, and
    wherein the stacked structure is doped with a donor impurity.

2. The semiconductor device according to claim 1, wherein the semiconductor substrate comprises an $In_xAl_{1-x}As$ layer or an $In_xAl_{1-x-y}Ga_yAs$ layer which has a composition controlled in such a manner that a lattice constant value discretely or continuously approaches a value of the electron transport layer from a value of a semiconductor material of the semiconductor substrate.

3. The semiconductor device according to claim 1, wherein the $Al_yGa_{1-y}As_zSb_{1-z}$ layer in contact with the electron transport layer is doped with a donor impurity.

4. The semiconductor device according to claim 3, wherein the donor impurity is Sn.

5. The semiconductor device according to any one of claims 1 to 4, wherein an Al composition y in the $Al_yGa_{1-y}As_zSb_{1-z}$ layer is not smaller than 0.3 and not larger than 0.8.

6. The semiconductor device according to any one of claims 1 to 4, wherein the $Al_yGa_{1-y}As_zSb_{1-z}$ layer has a thickness of not smaller than 1 nm and not larger than 100 nm.

7. The semiconductor device according to any one of claims 1 to 4, wherein a cap layer is provided on the second barrier layer.

* * * * *

UNITED STATES PATENT AND TRADEMARK OFFICE
CERTIFICATE OF CORRECTION

PATENT NO. : 8,441,037 B2  
APPLICATION NO. : 13/262292  
DATED : May 14, 2013  
INVENTOR(S) : Hirotaka Geka Page 1 of 1

It is certified that error appears in the above-identified patent and that said Letters Patent is hereby corrected as shown below:

On the Title Page, Item (30) should read

--(30)     Foreign Application Priority Data

Oct. 14, 2009    (JP) ....................2009-237661  
    Mar. 31, 2009    (JP) ....................2009-086150--.

Signed and Sealed this  
First Day of October, 2013

Teresa Stanek Rea  
*Deputy Director of the United States Patent and Trademark Office*